United States Patent [19]

Saigo et al.

[11] Patent Number: 5,734,099
[45] Date of Patent: Mar. 31, 1998

[54] POTENTIAL TRAVEL DISTANCE ESTIMATION SYSTEM FOR ELECTRIC AUTOMOBILES

[75] Inventors: Tsutomu Saigo; Kenichi Shimoyama; Youichi Arai, all of Susono, Japan

[73] Assignee: Yazaki Corporation, Tokyo, Japan

[21] Appl. No.: 778,722

[22] Filed: Dec. 27, 1996

[30] Foreign Application Priority Data

Dec. 28, 1995 [JP] Japan .................. 7-343966

[51] Int. Cl.$^6$ .................. G01R 19/00
[52] U.S. Cl. .................. 73/114; 73/113; 73/117.3; 364/424.026
[58] Field of Search .................. 73/116, 117.2, 73/117.3, 112, 113, 114; 364/424.026

[56] References Cited

U.S. PATENT DOCUMENTS

| | | | |
|---|---|---|---|
| 4,686,434 | 8/1987 | Kojima et al. | 364/424.026 |
| 5,176,213 | 1/1993 | Kawai et al. | 364/424.026 |
| 5,301,113 | 4/1994 | To et al. | 73/114 |
| 5,318,142 | 6/1994 | Bates et al. | 364/424.026 |
| 5,367,455 | 11/1994 | Kitagawa et al | 364/424.026 |
| 5,453,930 | 9/1995 | Imaseki et al. | 364/424.026 |
| 5,505,076 | 4/1996 | Parkman et al. | 73/113 |
| 5,532,671 | 7/1996 | Bachman et al. | 364/424.026 |
| 5,534,764 | 7/1996 | Masaki et al. | 364/424.026 |
| 5,539,399 | 7/1996 | Takahira et al. | 364/424.026 |

FOREIGN PATENT DOCUMENTS 7-44152  3/1995  Japan .

*Primary Examiner*—George M. Dombroske
*Attorney, Agent, or Firm*—Oblon, Spivak, McClelland, Maier & Neustadt, P.C.

[57] ABSTRACT

A computer is responsible for information on a running speed of an electric automobile, information on a terminal voltage and a discharge current of a battery, stored data on a total capacity of the battery, and reference data for defining a minimum capacity of the battery, to generate and process data on a travel distance of the automobile during a past time interval, data on a consumed capacity of the battery during the past time interval, data on a capacity reduction rate of the battery per unit travel distance, and data on a residual capacity of the battery at a current time, and provide information on a potential travel distance of the automobile, which is displayed.

9 Claims, 4 Drawing Sheets

POTENTIAL TRAVEL DISTANCE ESTIMATION SYSTEM FOR ELECTRIC AUTOMOBILES

BACKGROUND OF THE INVENTION

1. Field of the Invention

The present invention generally relates to a system for estimating a potential travel distance of an electric automobile, and particularly, to a potential travel distance estimation system for estimating a potential travel distance of an electric automobile by using a travel distance and a current total available capacity (hereafter sometimes referred to as "residual capacity") of a battery or batteries (hereafter simply "battery") of the automobile.

2. Description of Relevant Art

In the electric automobile, a current state of battery is always of concern. Conventionally, it has been given in terms of a residual capacity for the intended use.

For example, in a paper "Yuasa Jihou 1992. 4 No. 72" by Takao Marui et al., there is collected during a travel a set of data on battery discharge (voltage and current), of which values are substituted in a second-order recurrence equation (to be solved before a use for an estimation of a residual battery capacity), such that:

$$Y = \alpha X^2 + \beta X + \gamma$$

where,

X: a discharge quantity (as a residual capacity that can be discharged till an open-circuit voltage reaches a limit value), Y: the open-circuit voltage to be estimated for a prediction, and $\alpha, \beta, \gamma$: recurrence coefficients to be determined from the data on a terminal voltage and a discharge current of a concerned battery in a predetermined time interval.

This equation however needs complicated calculations for solution by a computer to have a defined recurrence expression as an approximate function. Still less, it has been difficult for a current quantity to be integrated in consideration of a recovery of battery capacity such as due to a restorating charge or a discharge interruption, thus resulting in a possible inaccuracy.

For a simplified calculation, there has been disclosed in Japanese Patent Application No. 7-44152 a residual battery capacity estimation method, which measures open-circuit voltages immediately after an ignition-on operation and an ignition-off opertion and a quantity of electric current consumed during a travel therebetween, to estimate therefrom a total capacity of a battery that is available for a subsequent travel.

In this travel, discharge data of the battery are stored to be averaged for a method of least squares to determine a current voltage of the battery, which voltage is employed in combination with a current value of electric current to determine a current consumed quantity, which is subtracted from the previous total capacity to determine a difference therebetween to be displayed as a residual capacity, which can thus be estimated in a facilitated manner.

SUMMARY OF THE INVENTION

The driver may however prefer for a grasp of a current battery state to know how much distance the automobile can yet travel, rather than looking a displayed residual capacity. The present invention addresses such points.

It therefore is an object of the present invention to provide a potential travel distance estimation system for electric automobiles that can display an accurate current potential travel distance in place of or in addition to a residual capacity.

To achieve the object, according to a first aspect of the present invention there is provided a potential travel distance estimation system for an electric automobile with a battery, the estimation system comprising a first means for obtaining first information on a running speed of the automobile, a second means for obtaining second information on a terminal voltage and a discharge current of the battery, a third means responsible for the first and second to generate and process first computed data on a travel distance of the automobile during a past time interval, second computed data on a consumed capacity of the battery during the past time interval, third computed data on a capacity reduction rate of the battery per unit travel distance, and fourth computed data on a residual capacity of the battery at a current time, and provide third information on a potential travel distance of the automobile, and a display means for displaying the third information.

Accordingly, an accurate potential travel distance at a current time is estimated in a simplified manner from data in a past time interval and displayed.

According to a second aspect of the invention, as it depends from the first aspect, the first information during the past time interval is processed to generate the first computed data.

According to a third aspect of the invention, as it depends from the first aspect, the second information during the past time interval is processed to generate the second computed data.

According to a fourth aspect of the invention, as it depends from the first aspect, the first computed data and the second computed data are processed to generate the third computed data.

Accrding to a fifth aspect of the invention, as it depends from the first aspect, the third means is responsible for information on a total capacity of the battery before the past time interval to sequentially process the second information for generating the fourth computed data.

According to a sixth aspect of the invention, as it depends from the first aspect, the third means is responsible for information on a minimum capacity of the battery to process the second information during the past time interval for generating data on an approximate function of a linear relationship between the terminal voltage and the discharge current, before processing the data on the approximate function and the information on the minimum capacity to generate the fourth computed data.

According to a seventh aspect of the invention, as it depends from the first aspect, the third computed data and the fourth computed data are processed for generating data on the third information.

Moreover, to achieve the object, according to an eighth aspect of the present invention, there is provided a potential travel distance estimation system for an electric automobile, comprising a representative capacity estimation means responsive to a respective one of predetermined time intervals during a travel of an electric automobile for storing data on a voltage of a battery of the automobile and a current conducted via a load of the battery, responding to a stored set of the data for obtaining an approximate straight line to determine an estimation capacity voltage of the battery, and responding to a total capacity of the battery determined after a previous travel stop of the automobile and the estimation capacity voltage of the battery to determine for the respective predetermined time interval a current residual capacity of the battery, a distance computing means operable with a commencement of the travel of the automobile to respond to a number of output pulses from a speed sensor of the automobile for determining a travel distance of the automobile per the respective predetermined time interval, and a potential travel distance estimation means operable during the travel of the automobile to respond to the travel distance and a set of the data stored per the respective predetermined time interval for determining a consumption rate per the travel distance, and to respond to the consumption rate and the total capacity for estimating to display a potential travel distance thereafter.

According to the eighth aspect of the invention, like the first aspect, during a travel of an electric automobile, there are obtained data per a predetermined time interval on a voltage of a battery and a conducted current as well as a travel distance to determine a consumption rate per the travel distance, which consumption rate is employed in combination with a previous total capacity for estimating to display a potential travel distance, so that a driver is informed of a distance the automobile is potent to travel thereafter.

According to a ninth aspect of the present invention, as it depends from the eighth aspect, the potential travel distance estimation means is adapted during the travel of the automobile to provide as the consumption rate one of an integrated value of the current per the respective predetermined time interval and an integrated value of the voltage of the battery and the current till the respective predetermined time interval is reached, and as the potential travel distance a quotient of the total capacity divided by the consumption rate.

According to the ninth aspect of the invention, during a travel, there are given a consumption rate per a predetermined time interval in terms of an integrated value of a current during a lapse of the predetermined time interval or an integrated value of the current and a voltage, and a potential travel distance in terms of a total capacity divided by the consumption rate in a sequential manner, so that the the potential travel distance is estimatable with an exact value.

According to a tenth aspect of the present invention, as it depends from the eighth aspect, the potential travel distance estimation system further comprises a current accumulation interruption decision means responsible for a higher value of the estimation capacity voltage of the battery of a current time than the estimation capacity voltage of the battery of a previous time to interrupt an accumulation of the current as averaged.

According to the tenth aspect of the invention, there is interrupted an accumulation of a current data when an estimated capacity representative voltage of a current time is higher than that of a previous time, eliminating the conventional need of a consideration for a recovery of capacity due to a restorative charge.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
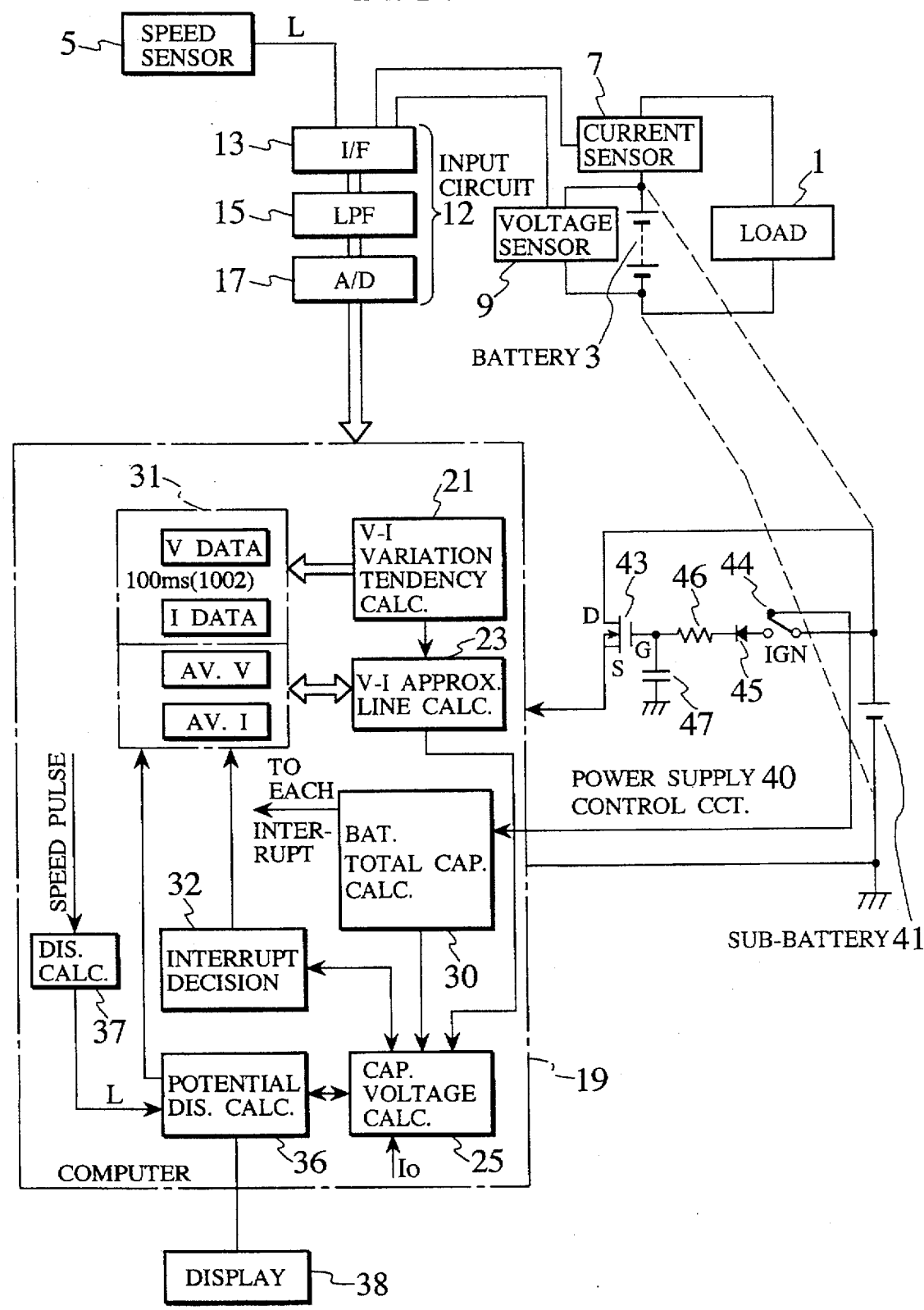
FIG. 1 is a block diagram of a potential travel distance estimation system of an electric automobile according to an embodiment of the invention.

There will be detailed below the preferred embodiments of the present invention with reference to the accompanying drawings. Like members are designated by like reference characters.

FIG. 1 shows, in a schematic block diagram, a potential travel distance estimation system of an electric automobile according to an embodiment of the invention.

Referring to FIG. 1, designated by reference character 1 is an electric automobile load (hereafter simply "load"), such as a motor, connected to a battery 3, 5 is a speed sensor that outputs a number of pulse signals corresponding to a speed of the automobile per a predetermined time interval, 7 is a current sensor for detecting a current conducted through the load, 9 is a voltage sensor for detecting a terminal voltage of the battery 3.

12 is a detection value input circuit, which comprises an I/F 13, an LPF 15 and an A/D 17. Analog detection signals are input from the speed sensor 5, the current sensor 7 and the voltage sensor 9 to the input circuit 12, where their noises are removed before their analog-to-digital conversion.

19 is a computer, of which software includes a voltage-current variation tendency calculating program or file 21, a voltage-current approximate straight line calculating program or file 23, an estimation capacity voltage calculating program or file 25, a total battery capacity calculating program or file 30, a current accumulation interrupt decision program or file 32, a potential travel distance calculating program or file 36, and a travel distance calculating program or file 37.

Moreover, the computer 19 is connected to a display 38 and a power supply control circuit 40. The computer 19 is operable with power supplied from the control circuit 40.

The voltage-current variation tendency calculating file 21 is responsible for the terminal voltage of the battery 3 and the discharge current, as they are detected and input from the detection value input circuit 12, to sample them e.g. every 100 ms and store in a memory 31, to have them averaged each time when they are individually collected up to 100 in number, and to start the voltage-current approximate straight line calculating file 23 each time when a total of 100 averaged values are collected respectively.

The voltage-current approximate straight line calculating file 23 is adapted to read from the memory 31 a plurality of averaged voltages and an identical plurality of averaged currents, determine a pair of coefficients a and b for a minimized error by a method of least squares, and respond to the coefficients a and b to have a defined voltage-current approximate linear function $Y=aX+b$.

The estimation capacity voltage calculation file 25 is operable each time when the voltage-current approximate linear function ($Y=aX+b$) is defined, for substituting a preset reference current value $I0$ in the function Y to estimate and store a current battery voltage called "estimation capacity voltage".

The total battery capacity calculating file 30 serves in response to a turn-off operation of an ignition switch 44 of the power supply control circuit 40, for reading an input terminal voltage from the detection value input circuit 12 as an open-circuit voltage, and comparing the open-circuit voltage with a stored open-circuit voltage, as it represents an open-circuit voltage at a time e.g. of an ignition-off operation or full charge state, to thereby determine a current total available capacity of the battery 3.

The current accumulation interrupt decision file 32 compares a previous estimation capacity voltage stored by the estimation capacity voltage calculating file 25 with a current estimation capacity voltage to decide, when this estimation capacity voltage is higher by a predetermined threshold than that estimation capacity voltage, that the current estimation capacity voltage be an estimation capacity voltage (hereafter "restorating charge voltage") accompanied by a restorating charge, before interrupting the accumulation of current data by the potential travel distance calculating file 36.

The potential travel distance calculating file 36 has been operated since a commencement of an associated travel, for storing a current of the memory 31 in correspondence with a temporal axis, and for storing a distance value to determine a travel distance at a respective one of predetermined time intervals, e.g. 10 minutes.

It then employs the stored current and the stored travel distance to determine therefrom a consumption rate per this travel distance, which consumption rate is employed in combination with the total battery capacity obtained in advance, to determine a current residual capacity of the battery.

The current residual capacity is then divided by the consumption rate per unit travel distance to determine a potential travel distance the automobile could travel thereafter, which distance is displayed on the display 38.

The travel distance calculating file 37 is for storing pulse signals from the speed sensor 5 to determine a travel distance per predetermined time interval.

The power supply control circuit 40 comprises a sub-battery 41, a capacitor 47, and a serial circuit consisting of a power MOS FET 43, an ignition key switch 44, a diode 45 and a resistor 46. The power MOS FET 43 has a drain D connected to the sub-battery 41, and a source S connected to the computer 19. The serial circuit is connected at one end to the sub-battery 41 and at the other end to a gate G of the power MOS FET 43, which gate G is connected to the capacitor 47.

Figure 2:
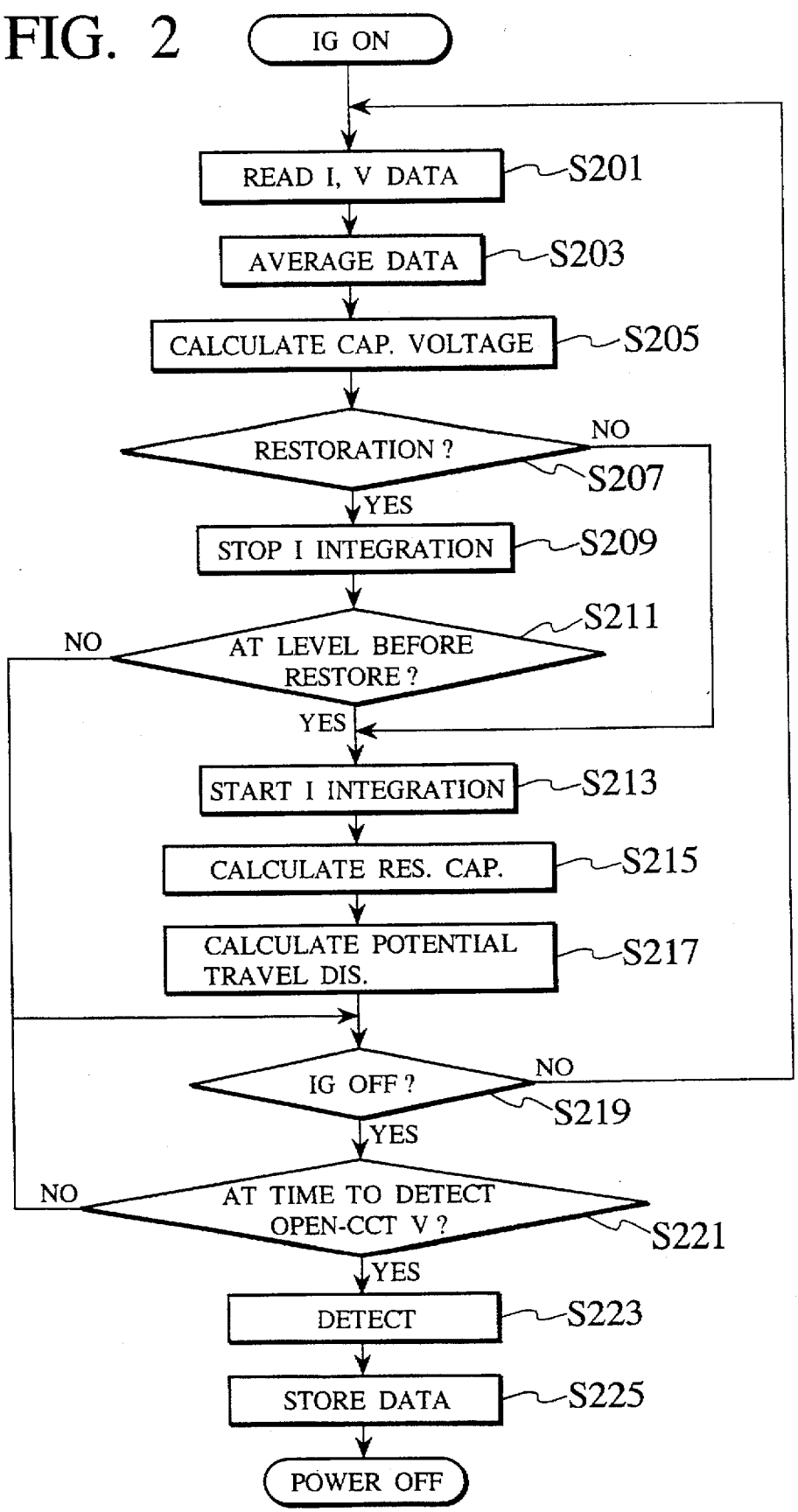
FIG. 2 is a flow chart of actions of the potential travel distance estimation system of FIG. 1.

There will be described actions of the potential travel distance estimation system. FIG. 2 is a flow chart of actions of the potential travel distance estimation system. It is now assumed that a total or capacity of the battery has been obtained since a last or previous stop (by an ignition-off operation) of the automobile.

Figure 3:
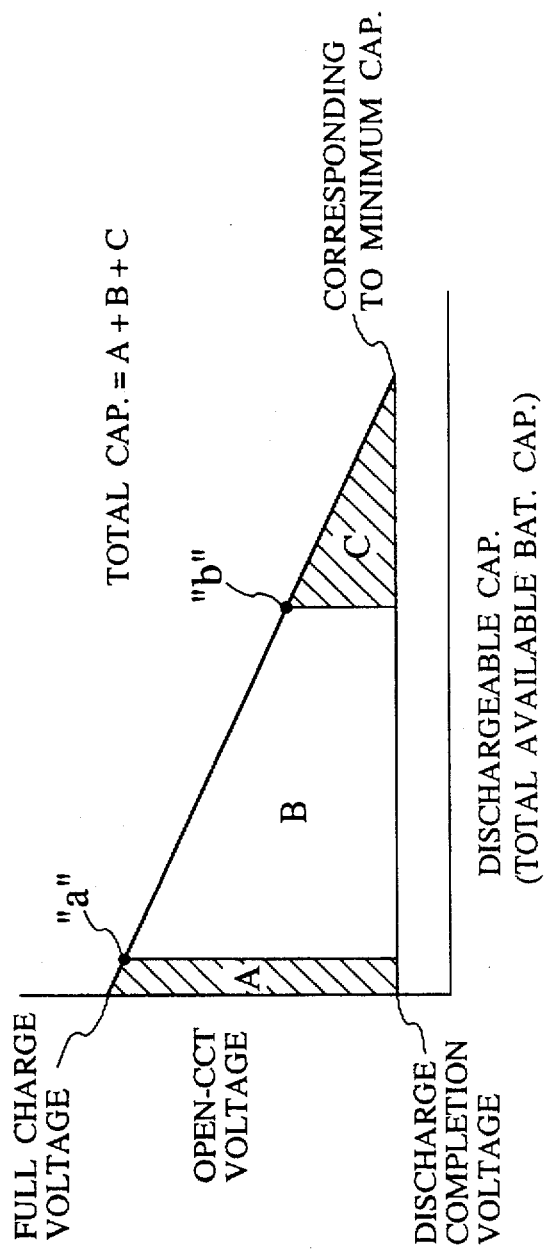
FIG. 3 is a graph describing a total battery capacity in conjunction with an open-circuit voltage.

The total capacity of the battery is defined as an integration of a triangular area in FIG. 3, under a stright line connecting a point "a" of an open-circuit voltage after a full charge and a point "b" of an open-circuit voltage at a stop of the automobile, and above a discharge completion or ending voltage corresponding to a minimum capacity, where the discharge current has a reference value I0.

In the computer 19, at a step S201, the voltage-current variation tendency calculating file 21 reads to store in the memory 31 voltage data on a terminal voltage detected by the voltage sensor 9 and current data on a discharge current detected by the current sensor 7, as the automobile travels.

At a step S203, the voltage data as well as the current data are collected, to be averaged each time when they amount to 100 in number. Concurrently, the potential travel distance calculating file 36 reads the current data from the memory 31, storing them in correspondence to a temporal axis.

At a step S205, the averaged voltage and current data are processed for the voltage-current approximate line calculating file 23 to determine an approximate straight line $Y=aX+b$ by a method of least squares, and for the estimation capacity voltage calculating file 25 to substitute the reference discharge current I0 in the approximate line, thereby obtaining a corresponding estimation capacity voltage, which is stored.

At a step S207, the current accumulation interrupt decision file 32 reads the estimation capacity voltage, checking for a capacity recovery caused by a restoration or a discharge interruption, to make a decision whether or not it is effected, e.g. such that it should have been effected if a restorating charge voltage is higher than a previous estimation capacity voltage.

Upon an affirmative decision for a capacity recovery by a restoration or a discharge interruption, the program flow of the current accumulation interruption decision file 32 goes to a step S209, where it interrupts the current accumulation.

Then, the flow goes to a step S211 for checking for a recovery to a level of an estimation capacity voltage before the capacity recovery due to the restortion or the discharge interruption to make a decision whether or not is it achieved, e.g. such that an estimation capacity voltage V should have been recovered to the level of the estimation capacity voltage before the capacity recovery due to the restoration or the discharge interruption, as it has recovered a previous estimation capacity voltage before it reaches a restoration charge voltage.

When the voltage V has recovered the level of the estimation capacity voltage before the capacity recovery due to the restoration or the discharge interruption, the flow of the current accumulation interruption decision file 32 goes to a step S213, where it restarts an integration for the current accumulation.

Figure 4:
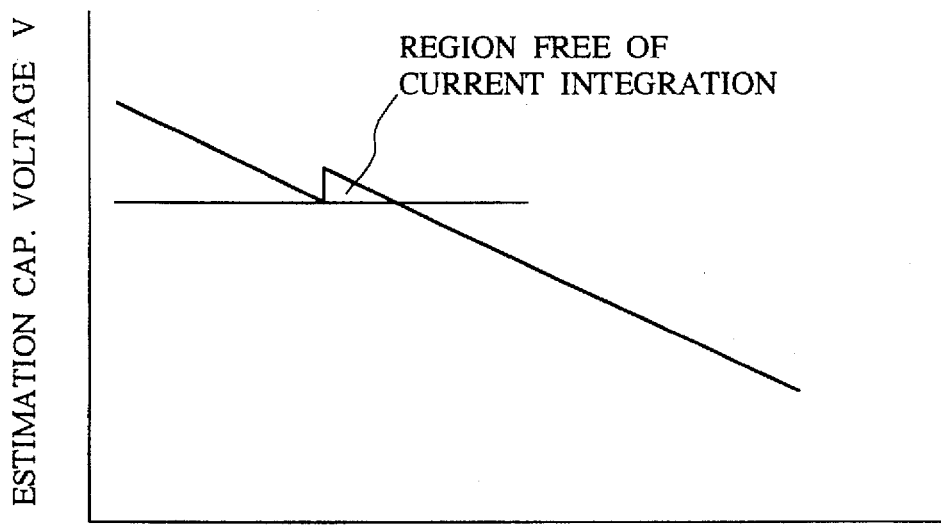
FIG. 4 is a graph describing an accumulation interruption of a current.

In other words, as the estimation capacity voltage V of the battery has a linear relationship to the current total battery capacity as shown in FIG. 4 by straight line segments, the program responds to a rise (a region free of current integration) of such a straight line to decide that it should be by a restorating charge, causing the integration of current data to be interrupted. As in the figure, when a level of an estimation capacity voltage just before the rise is recovered, the current data accumulation is restarted.

The potential travel distance calculation file 36 makes an accumulation of the current data of the memory 31 in correspondence to the temporal axis, as well as of the distance value determined by the travel distance calculation file 37 to determine a travel distance at predetermined intervals of time.

At a step S215, the accumulated current and the estimation capacity voltage determined by the estimation capacity voltage calcution file 25 are processed to obtain data on a capacity consumption rate or capacity reduction rate per unit distance of the travel distance determined above, which data are processed in combination with previous data on the total capacity of the battery to make an estimation of a residual capacity of the battery thereafter.

At a subsequent step S217, the residual capacity of the battery is divided by the consumption rate per unit distance to determine a potential travel distance thereafter, which is displayed on the display 38.

Figure 5:
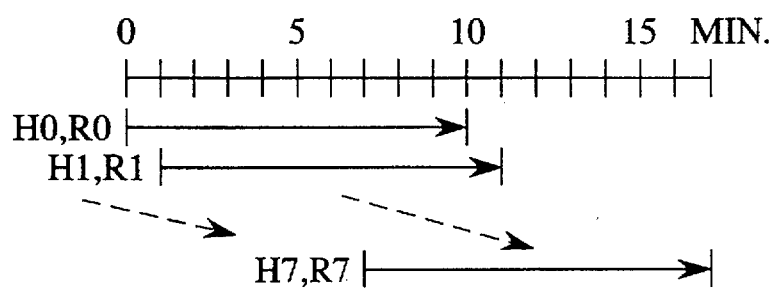
FIG. 5 is a time chart describing an estimation step of a potential travel distance.

FIG. 5 is a time chart describing an estimation step of the potential travel distance. In the figure, designated at reference character R0 is a travel distance during an initial time interval of a predetermined length of e.g. 10 minutes, R1 is that during a next time interval of the predetermined length starting after a lapse of a unit time of one minute, ..., R7 is that during a time interval of the predetermined length starting after a lapse of seven minutes; and H0, H1, ..., H7 are each respectively an identified capacity consumption for a corresponding one of the time intervals.

Letting i be a time interval identification number, the respective time intervals have their values Hi of consumption as integrated values of current or integrated values of current and voltage, which are each processed by dividing a corresponding travel distance Ri to determine a corresponding consumption rate Pi per unit travel distance, such that: Pi=Hi/Ri.

Data on the capcity consumption Hi are processed in combination with data on a previous total capacity W of the battery to determine an estimated battery capacity SOC.

For example, in FIG. 3, as a region B corresponds to the capacity consumption, the total battery capacity W is equivalent to a total region of A+B+C and hence the residual battery capacity SOC is equivalent to (A+B+C)−B.

The residual battery capacity SOC is then divided by the capacity consumption rate Pi per unit travel distance to determine a potential travel distance, such that:

Potential travel distance=SOC/Pi.

Then, at a step S219, the total battery capacity calculation file 30 makes a decision as to whether an ignition is off or not. If it is not off, the program flow again goes the step S201 for necessary control.

If the ignition is off, the flow goes to a step S221 for checking if it is a time for measuring an open-circuit voltage.

Unless it is so at the step S221, the flow circulates between the steps S219 and S221 until the time for measurement elapses.

The step S221 will be further described. When the ignition is e.g. turned off after a stop of a travel of the electric automobile, the battery 3 has its terminal voltage slowly approach to an open-circuit voltage.

In other words, if the ignition is again turned on immediately after the turn-off operation following the travel stop, the sub-battery 41 has its voltage little varied after the turn-off. Therefore, after an ignition-off, the power is not promptly turned off, but turned off subject to a check for an arrival to the open-circuit voltage by controlling at the end of hardware the FET 43 with the capacitor 47, of which a time constant is set to a time corresponding to a necessary time for the open-circuit voltage to be matured after the ignition-off.

At the step S221, if the time for measuring the open-circuit voltage has come, the flow goes to a step S223 for the measurement of open-circuit voltage to determine a current total battery capacity, before it goes to a step S225 for storing data on this total battery capacity.

Accordingly, in a subsequent travel as well as in the current travel, the driver is always permitted to be informed of a potential travel distance of the automobile.

While preferred embodiments of the present invention have been described using specific terms, such description is for illustrative purposes, and it is to be understood that changes and variations may be made without departing from the spirit or scope of the following claims.

What is claimed is:

1. A potential travel distance estimation system for an electric automobile with a battery, the estimation system comprising:

a first means for obtaining first information on a running speed of the automobile;

a second means for obtaining second information on a terminal voltage and a discharge current of the battery;

a third means for generating and processing first computed data on a travel distance of the automobile during a past time interval, second computed data on a consumed capacity of the battery during the past time interval, and third computed data on a capacity reduction rate of the battery per unit travel distance, for computing an approximate linear relationship between the terminal voltage and the discharge current, for computing fourth computed data on a residual capacity of the battery at a current time based on a minimum capacity of the battery and the approximate linear relationship, and for providing third information on a potential travel distance of the automobile; and a display means for displaying the third information.

2. A potential travel distance estimation system according to claim 1, wherein the means for generating and processing comprises means for processing the first information during the past time interval to generate the first computed data.

3. A potential travel distance estimation system according to claim 1, wherein the means for generating and processing comprises means for processing the second information during the past time interval to generate the second computed data.

4. A potential travel distance estimation system according to claim 1, wherein the means for generating and processing comprises means for processing the first computed data and the second computed data to generate the third computed data.

5. A potential travel distance estimation system according to claim 1, wherein the means for generating and processing comprises means for processing a total capacity of the battery before the past time interval to sequentially process the second information for generating the fourth computed data.

6. A potential travel distance estimation system according to claim 1, wherein the means for generating and processing comprises means for processing the third computed data and the fourth computed data for generating data on the third information.

7. A potential travel distance estimation system for an electric automobile, comprising:

a representative capacity estimation means responsive to a respective predetermined time interval of plural predetermined time intervals during a travel of an electric automobile for storing data on a voltage of a battery of the automobile and a current conducted via a load of the battery, for determining an approximate straight line to determine an estimation capacity voltage of the battery based on a stored set of the data on voltage and current, and for determining, for the respective predetermine time interval, a current residual capacity of the battery based on a total capacity of the battery determined after a previous travel stop of the automobile;

a distance computing means operable with a commencement of the travel of the automobile to respond to a number of output pulses from a speed sensor of the automobile for determining a travel distance of the automobile per the respective predetermined time interval; and a potential travel distance estimation means operable during the travel of the automobile to respond to the travel distance and a set of the data on voltage and current stored per the respective predetermined time interval for determining a consumption rate per the travel distance, and to respond to the consumption rate and the total capacity for displaying an estimated potential travel distance thereafter.

8. A potential travel distance estimation system according to claim 7, wherein the potential travel distance estimation means comprises means for determining, during the travel of the automobile, the consumption rate as one of 1) an integrated value of the current per the respective predetermined time interval and 2) an integrated value of the voltage of the battery and the current until the respective predetermined time interval is reached, and for determining as the potential travel distance a quotient of the total capacity divided by the consumption rate.

9. A potential travel distance estimation system according to claim 7, further comprising:

a current accumulation interruption decision means for interrupting an accumulation of the current being averaged when the estimation capacity voltage of the battery of a current time is higher than the estimation capacity voltage of the battery of a previous time.

* * * * *